US012719023B2

(12) United States Patent
Sueki et al.

(10) Patent No.: US 12,719,023 B2
(45) Date of Patent: Aug. 25, 2026

(54) SURFACE TREATMENT APPARATUS

(71) Applicant: Shibaura Machine Co., Ltd., Tokyo (JP)

(72) Inventors: Rintaro Sueki, Numazu (JP); Kazuhiro Fukada, Sunto-gun (JP); Takeshi Namba, Numazu (JP)

(73) Assignee: Shibaura Machine Co., Ltd., Tokyo (JP)

(*) Notice: Subject to any disclaimer, the term of this patent is extended or adjusted under 35 U.S.C. 154(b) by 0 days.

(21) Appl. No.: 18/726,294

(22) PCT Filed: Nov. 14, 2022

(86) PCT No.: PCT/JP2022/042236
§ 371 (c)(1),
(2) Date: Jul. 2, 2024

(87) PCT Pub. No.: WO2023/132130
PCT Pub. Date: Jul. 13, 2023

(65) Prior Publication Data

US 2025/0079126 A1 Mar. 6, 2025

(30) Foreign Application Priority Data

Jan. 7, 2022 (JP) ................................ 2022-001473
May 30, 2022 (JP) ................................ 2022-087439

(51) Int. Cl.
*H01J 37/32* (2006.01)
*C23C 14/00* (2006.01)

(52) U.S. Cl.
CPC ...... *H01J 37/3244* (2013.01); *C23C 14/0063* (2013.01); *H01J 37/32715* (2013.01);
(Continued)

(58) Field of Classification Search
None
See application file for complete search history.

(56) References Cited

U.S. PATENT DOCUMENTS 4,849,087 A * 7/1989 Meyer ..................... C23C 14/54
204/298.03
5,047,131 A * 9/1991 Wolfe ..................... C23C 14/35
204/298.22

(Continued)

FOREIGN PATENT DOCUMENTS

JP 64-4473 A 1/1989
JP 2003-297818 A 10/2003

(Continued)

OTHER PUBLICATIONS

International Search Report issued Jan. 24, 2023 in PCT/JP2022/042236 filed on Nov. 14, 2022, 2 pages.

(Continued)

*Primary Examiner* — Jason Berman
(74) *Attorney, Agent, or Firm* — Oblon, McClelland, Maier & Neustadt, L.L.P.

(57) ABSTRACT

A surface treatment apparatus (10) performs film formation on a surface of a workpiece (W) in a chamber (20), and includes: an HCD electrode (210) (electrode) that supplies reaction gas to the workpiece (W) or a sputtering electrode (220) (electrode) that releases target particles to the workpiece (W), the HCD electrode (210) or the sputtering electrode (220) being placed facing the workpiece (W); a gas supply pipe (90) that is installed along an outer periphery of the electrode and has, along a longitudinal direction of the pipe, a plurality of gas ejection ports (91) through which film-forming gas, or an inert gas or a reactive gas for performing sputtering is supplied to an electrode surface of the electrode; and an exhaust device (51) (gas discharge unit) that discharges residual gas after film formation is ended, and the plurality of gas ejection ports (91) are arranged such that gas supplied from the gas supply pipe
(Continued)

(90) is uniformly distributed on the electrode surface of the electrode.

13 Claims, 12 Drawing Sheets

(52) U.S. Cl.
CPC .................. *H01J 37/32834* (2013.01); *H01J 2237/20214* (2013.01); *H01J 2237/332* (2013.01)

(56) References Cited

U.S. PATENT DOCUMENTS 5,384,021 A * 1/1995 Thwaites ............ H01J 37/3405 204/298.22
6,135,053 A * 10/2000 Okamura .......... C23C 16/45578 118/723 E
6,474,570 B2 11/2002 Chen
8,011,315 B2 9/2011 Matsumoto et al.
2004/0025786 A1 2/2004 Kontani et al.
2004/0118678 A1 6/2004 Hartig
2005/0115823 A1* 6/2005 Davis .................... C23C 14/352 204/192.12
2005/0218115 A1* 10/2005 Lei .................... C23C 16/45563 156/345.33
2008/0121180 A1 5/2008 Kontani et al.
2008/0251014 A1 10/2008 Kontani et al.
2008/0251015 A1 10/2008 Kontani et al.
2010/0015811 A1* 1/2010 Sato .................... H01L 21/0228 438/758
2010/0156300 A1* 6/2010 Lin ....................... H01J 37/321 315/111.51
2010/0263593 A1 10/2010 Kontani et al.
2019/0090341 A1 3/2019 Takahashi et al.

FOREIGN PATENT DOCUMENTS

JP 2010-90458 A 4/2010
JP 2012-114200 A 6/2012
WO WO 2017/159838 A1 9/2017
WO WO 2017/164508 A1 9/2017

OTHER PUBLICATIONS

Taiwanese Office Action issued Jun. 1, 2023 in TW 111146333, 16 pages (with English Translation).

* cited by examiner

10
W
22
220
B
21
210
A
20
23a
23b
50
48
47
41
40
44a
43
42
30
Z1
Z2
53
52
51
44b
X
Y
Z 10
43
Y
Z
X
W
32
D
22
Z2
220
53
210
Z1
21
31
42
C
40
W
20
44b

SURFACE TREATMENT APPARATUS

CROSS-REFERENCE TO RELATED APPLICATIONS

This application is a national stage application of International Application No. PCT/JP2022/042236 filed Nov. 14, 2022, which designates the United States, incorporated herein by reference, and which claims the benefit of priority from Japanese Patent Application No. 2022-001473, filed Jan. 7, 2022, and Japanese Patent Application No. 2022-087439, filed May 30, 2022, the entire contents of which are incorporated herein by reference.

TECHNICAL FIELD

The present invention relates to a surface treatment apparatus that performs surface treatment on a workpiece.

BACKGROUND ART

Thus far, a surface treatment apparatus that uses plasma to clean or modify a surface of a workpiece and thereby forms a metal catalyst layer, a SiOx film, or the like and a surface treatment apparatus that uses a sputtering apparatus to form a thin film on a surface of a workpiece have been known.

For example, Patent Literature 1 discloses a film formation apparatus that performs film formation on one surface of a workpiece.

CITATION LIST

Patent Literature

Patent Document 1: WO 2017/159838 A

SUMMARY OF INVENTION

Problem to be Solved by the Invention

In the process of plasma CVD or reactive sputtering, in order to perform uniform film formation on a surface of a workpiece, it is necessary that gas used for film formation be supplied and distributed equally for placement of an electrode. In the conventional surface treatment apparatus disclosed in Patent Literature 1, in order to avoid abnormal discharge with an electrode, gas is supplied by providing a pipe on the outer periphery of the electrode and arranging gas blowout ports at equal intervals on the pipe. However, in the case where a long-length electrode adapted to film formation on a large-area substrate or a plurality of substrates arranged in parallel is used, the path of the gas supply pipe needs to be lengthened according to the length of the electrode, and a bias occurs in gas distribution between upstream and downstream in the pipe. Further, in the case where a gas discharge port is located immediately below an electrode, it has been the case that downstream gas is sucked into the discharge port and consequently the bias in gas distribution between upstream and downstream is more significant.

The present invention has been made in view of the above, and an object of the present invention is to provide a surface treatment apparatus in which gas supplied from a gas supply pipe can be uniformly distributed on an electrode surface of an electrode that performs surface treatment.

Means for Solving Problem

In order to solve the above problem, and achieve the object, a surface treatment apparatus according to the present invention performs film formation on a surface of a workpiece in a chamber, and includes: an electrode that is placed facing the workpiece and supplies reaction gas or releases target particles to the workpiece; a gas supply pipe that is installed along an outer periphery of the electrode and has, along a longitudinal direction of the pipe, a plurality of gas ejection ports through which film-forming gas, or an inert gas or a reactive gas for performing sputtering is supplied to an electrode surface of the electrode; and a gas discharge unit that discharges residual gas after film formation is ended, wherein the plurality of gas ejection ports are arranged such that gas supplied from the gas supply pipe is uniformly distributed on the electrode surface of the electrode.

Effect of the Invention

A surface treatment apparatus according to the present invention exhibits an effect in which gas supplied from a gas supply pipe can be uniformly distributed on an electrode surface.

DESCRIPTION OF EMBODIMENTS

Hereinbelow, embodiments of a surface treatment apparatus according to the present disclosure are described in detail based on the drawings. Note that this invention is not limited by the embodiments. Further, constituent elements in the following embodiments include those that can be substituted and easily conceived by those skilled in the art, or those that are substantially the same.

First Embodiment

A first embodiment of the present disclosure is an embodiment in which desired surface treatment is performed on one surface of a workpiece W molded with, for example, a resin material such as a plastic resin. The surface treatment of the workpiece W is, for example, film formation treatment.

[1. Configuration of the Surface Treatment Apparatus]

Figure 1:
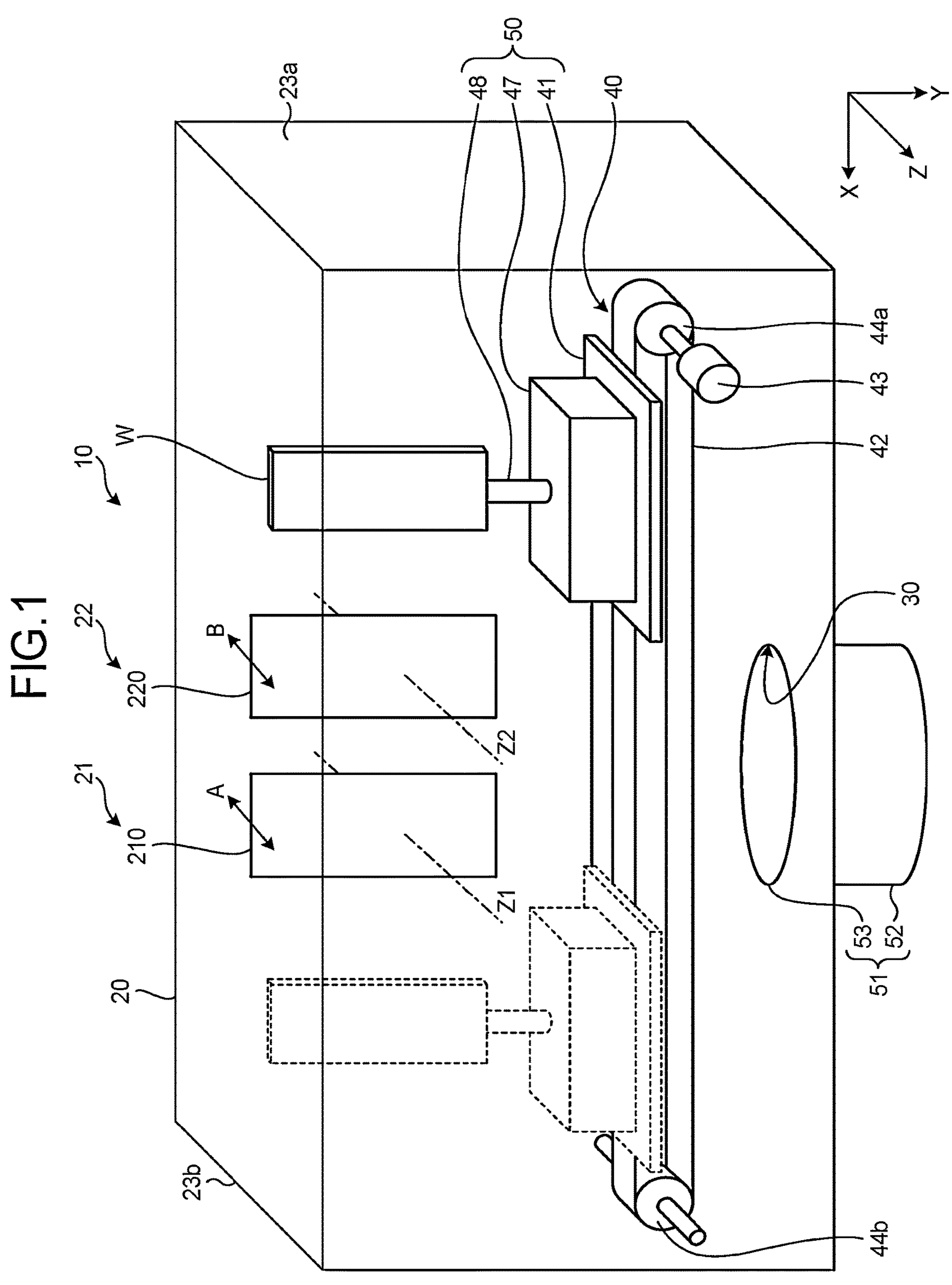
FIG. 1 is a schematic configuration diagram illustrating an example of a configuration of a surface treatment apparatus that performs one-surface film formation.
Figure 2:
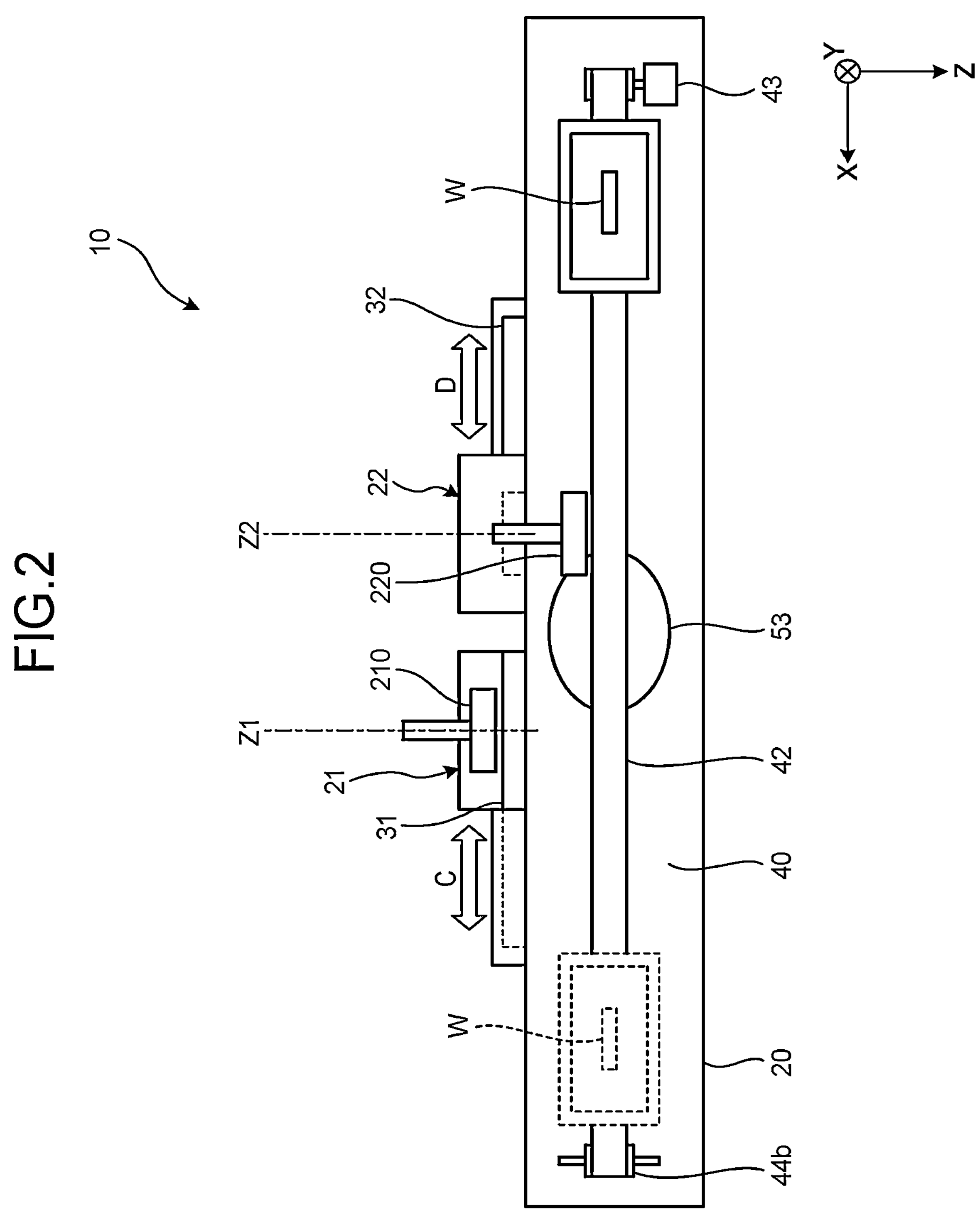
FIG. 2 is a top view illustrating an example of a configuration of the interior of a chamber of the surface treatment apparatus of FIG. 1.

A schematic configuration of a surface treatment apparatus 10 will now be described using FIGS. 1 and 2. FIG. 1 is a schematic configuration diagram illustrating an example of a configuration of a surface treatment apparatus that performs one-surface film formation. FIG. 2 is a top view illustrating an example of a configuration of the interior of a chamber of the surface treatment apparatus of FIG. 1.

The surface treatment apparatus 10 includes a workpiece mounting unit 50, a workpiece conveyance unit 40, an HCD (hollow cathode discharge) electrode 210, and a sputtering electrode 220, which are enclosed in a chamber 20.

The chamber 20 is a sealed reaction vessel in which surface treatment is performed on the workpiece W housed therein. The chamber 20 has a rectangular parallelepiped shape of which the longitudinal direction is the X-axis direction in the XYZ coordinate system illustrated in FIG. 1.

The workpiece mounting unit 50 holds the workpiece W thereon in a state of keeping it substantially standing along the Y-axis. The workpiece mounting unit 50 includes a movement stage 41, an attachment stage 47, and an attachment shaft 48.

The movement stage 41 is a pedestal on which the workpiece W is set. The movement stage 41 is conveyed along the X-axis by the workpiece conveyance unit 40 described later.

The attachment stage 47 is a member that is installed on the movement stage 41 and serves as a base to which the workpiece W is attached.

The attachment shaft 48 supports the workpiece W on the attachment stage 47.

The workpiece conveyance unit 40 conveys the workpiece W mounted on the workpiece mounting unit 50 along the longitudinal direction of the chamber 20 (the X-axis).

The workpiece conveyance unit 40 is a single-axis movement table driven by a conveyance motor 43. Specifically, the workpiece conveyance unit 40 uses the rotational driving force of the conveyance motor 43 to convey, along the X-axis, the movement stage 41 fixed to a timing belt 42 stretched between two pulleys 44*a* and 44*b*.

Since the workpiece W is mounted on the movement stage 41 via the attachment stage 47 and the attachment shaft 48, the workpiece W is conveyed along the X-axis by the workpiece conveyance unit 40.

A plasma treatment apparatus 21 and a sputtering apparatus 22 are installed on one side surface spreading along the XY plane of the chamber 20.

The plasma treatment apparatus 21 irradiates the workpiece W with plasma generated by the HCD electrode 210, and thereby performs surface treatment of the workpiece W. By this surface treatment, for example, a $SiO_2$ layer is generated on a surface of the workpiece W. Thereby, the environment resistance of the surface of the workpiece w is improved. The plasma treatment apparatus 21 is an example of the surface treatment apparatus in the present disclosure.

The HCD electrode 210 is movable along an axis 21 parallel to the Z-axis, that is, in the direction of arrow A. Thus, more uniform film formation treatment can be performed by setting the spacing between the workpiece W and the HCD electrode 210 to an optimum value. The HCD electrode 210 is an example of the electrode in the present disclosure.

The sputtering apparatus 22 performs sputtering by ejecting atoms used for film formation from a target placed on the sputtering electrode 220 and causing the ejected atoms to adhere to a surface of the workpiece W. By sputtering, for example, a thin film serving as an underlayer of plating processing is formed on the surface of the workpiece W. The sputtering apparatus 22 is an example of the surface treatment apparatus in the present disclosure.

The sputtering electrode 220 is movable along an axis Z2 parallel to the Z-axis, that is, in the direction of arrow B. Thus, more uniform film formation treatment can be performed by setting the spacing between the workpiece W and the sputtering electrode 220 to an optimum value. The sputtering electrode 220 is an example of the electrode in the present disclosure.

An exhaust device 51 is installed on the bottom surface of the chamber 20. The exhaust device 51 reduces the pressure of the interior of the chamber 20 into a vacuum state. Further, the exhaust device 51 discharges gas (reaction gas) filling the interior of the chamber 20 due to surface treatment. The exhaust device 51 includes a pump unit 52 and a lifting valve 53. The pump unit 52 is attached to the bottom surface of the chamber 20, and adjusts the pressure of the interior of the chamber 20 and discharges gas filling the interior of the chamber 20 due to an operation of the plasma treatment apparatus 21 or the sputtering apparatus 22. The pump unit 52 is configured using, for example, a rotary pump or a turbomolecular pump. The lifting valve 53 moves between, for example, a state of being in contact with the bottom surface of the chamber 20 and a state of having moved on the negative side of the Y-axis, and thereby opens an opening 30 formed in the bottom surface of the chamber 20 to the atmosphere. The exhaust device 51 is an example of a gas discharge unit in the present disclosure.

Both side surfaces spreading along the YZ plane of the chamber 20 include opening/closing doors 23*a* and 23*b*. The opening/closing doors 23*a* and 23*b* can be opened and closed by a hinge mechanism or a slide mechanism. An operator of the surface treatment apparatus 10 opens and closes the opening/closing doors 23*a* and 23*b* to set the workpiece W and take out the workpiece W for which surface treatment is completed.

The surface treatment apparatus 10 further includes a cooling device, a control device, a power supply device, a gas supply device, an operating panel, etc., but illustration of them is omitted for simplicity of description. The cooling device generates cooling water that cools equipment, a power source, etc. The control device controls the entire surface treatment apparatus 10. The power supply device accommodates power to be supplied to each part of the surface treatment apparatus 10. The gas supply device supplies film-forming gas and reaction gas to the chamber 20. The operating panel accepts an operating instruction to the surface treatment apparatus 10. Further, the operating panel has a function of displaying an operating state of the surface treatment apparatus 10.

The chamber 20 includes a shutter 31 and a shutter 32 illustrated in FIG. 2. The shutters 31 and 32 are examples of a shielding member in the present disclosure.

The shutter 31 moves along arrow C. The shutter 31 moves on the positive side of the X-axis to expose the HCD electrode 210 when performing plasma treatment on the workpiece W. Further, the shutter 31 moves on the negative side of the X-axis to house the HCD electrode 210 when performing sputtering treatment on the workpiece W. Thereby, contamination of an electrode that is not used is prevented.

The shutter 32 moves along arrow D. The shutter 32 moves on the negative side of the X-axis to expose the sputtering electrode 220 when performing sputtering treatment on the workpiece W. Further, the shutter 32 moves toward the positive side of the X-axis to house the sputtering electrode 220 when performing plasma treatment on the workpiece W. Thereby, contamination of an electrode that is not used is prevented.

It is desirable that, during film formation, the HCD electrode 210 not be moved along axis 21 and the sputtering electrode 220 not be moved along axis Z2; however, the amounts of feeding in the axis 21 direction and the axis 22 direction may be changed according to the degree of vacuum of the interior of the chamber 20, the gas flow rate, the conveyance speed of the workpiece W, the power, the voltage value, the current value, the discharge state, the temperature of the interior of the chamber 20, etc., as appropriate. Thereby, more uniform film formation treatment can be performed. Further, the conveyance speed of the workpiece W may be changed according to the values of the parameters mentioned above.

[2. Structure of Connection of a Load-Lock Chamber]

Figure 3:
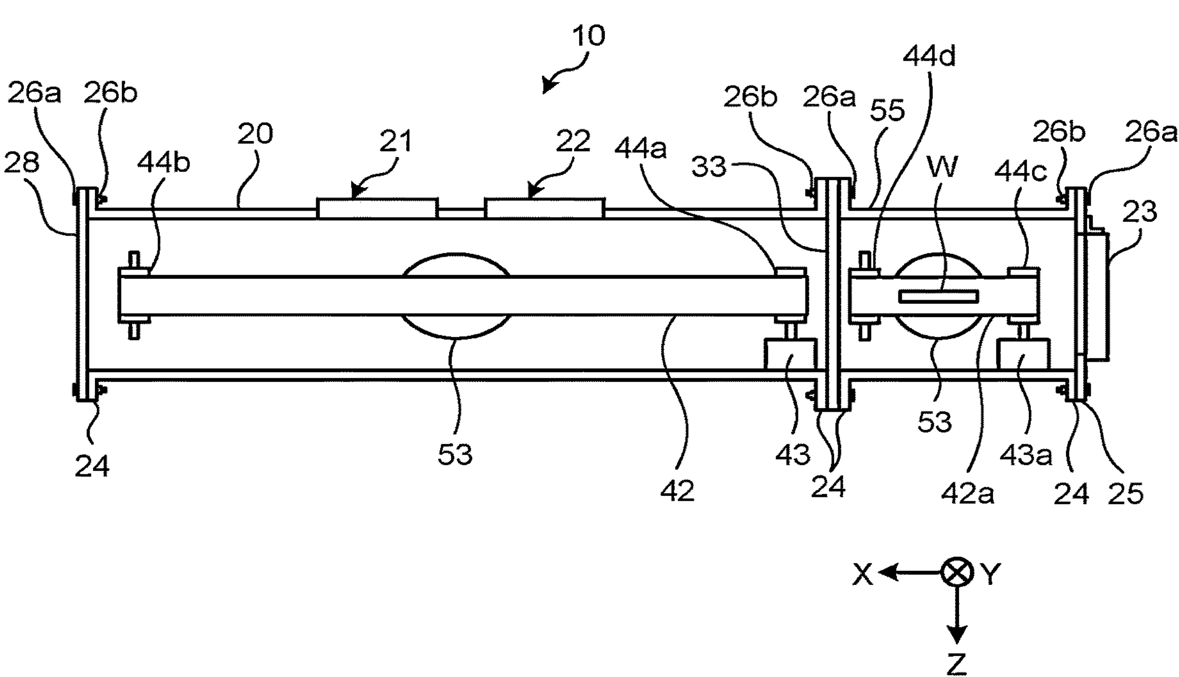
FIG. 3 is a top view illustrating an example of a configuration in which a load-lock chamber is connected to the surface treatment apparatus of FIG. 1.

A configuration in which a load-lock chamber 55 is connected to the chamber 20 will now be described using FIG. 3. FIG. 3 is a top view illustrating an example of a configuration in which a load-lock chamber is connected to the surface treatment apparatus of FIG. 1.

FIG. 3 is a top view illustrating an example of a state where a load-lock chamber 55 is further coupled to the surface treatment apparatus 10 illustrated in FIGS. 1 and 2. The load-lock chamber 55 is connected in the position of the opening/closing door 23*a* (see FIG. 1) of the chamber 20 via an openable/closable shutter 33 illustrated in FIG. 3 that is installed in place of the opening/closing door 23*a*. The load-lock chamber 55 houses the workpiece W before being subjected to surface treatment (film formation treatment), and reduces the pressure of the interior to remove atmospheric components adhering to the workpiece W. The workpiece W for which film formation treatment is completed is moved to the load-lock chamber 55, then the pressure of the interior of the load-lock chamber 55 is increased to atmospheric pressure, and then the workpiece W is taken out of the load-lock chamber 55. Thus, by using the load-lock chamber 55, film formation treatment can be performed without exposing the workpiece W to the atmosphere.

In FIG. 3, the chamber 20 and the load-lock chamber 55 are fastened at flanges 24 formed in end portions of them, by bolts 26*a* and nuts 26*b*.

A shutter 33 is installed between the chamber 20 and the load-lock chamber 55. The shutter 33 has a function of a gate valve that partitions the load-lock chamber 55 and the chamber 20. For example, the shutter 33 moves along the Y-axis to bring the chamber 20 and the load-lock chamber 55 into a communicating state or a non-communicating state.

The load-lock chamber 55 includes a lifting valve 53 in a bottom portion. The lifting valve 53 has a similar configuration and a similar function to the lifting valve 53 included in the chamber 20. The lifting valve 53 cooperates with a pump unit, which is not illustrated in FIG. 3, to control the pressure of the interior of the load-lock chamber 55.

The surface treatment apparatus 10 illustrated in FIG. 3 includes a timing belt 42*a* in the interior of the load-lock chamber 55. The timing belt 42*a* moves the workpiece W along the X-axis in the interior of the load-lock chamber 55. The timing belt 42*a* is stretched between a pulley 44*c* rotationally driven by a conveyance motor 43*a* provided on the negative side of the X-axis and a pulley 44*d* provided on the negative side of the X-axis.

The pulley 44*d* around which the timing belt 42*a* installed in the interior of the load-lock chamber 55 is stretched is in a position close to the pulley 44*a*. Therefore, the workpiece W that has moved in the interior of the load-lock chamber 55 transfers from the timing belt 42*a* to the timing belt 42. Then, the workpiece W moves in the interior of the chamber 20 by means of the timing belt 42. The workpiece W for which surface treatment is completed moves in the interior of the chamber 20 in the negative direction of the X-axis by means of the timing belt 42. Then, the workpiece W transfers from the timing belt 42 to the timing belt 42*a*, and thereby moves to the load-lock chamber 55.

Although not illustrated, also a configuration in which a conveyance arm is provided in the interior of the load-lock chamber 55 and the workpiece W is moved onto the timing belt 42 by the conveyance arm is possible.

The load-lock chamber 55 includes an opening/closing door 23 on the wall surface opposite to the side connected to the chamber 20. The opening/closing door 23 is attached to a door frame 25 in an openable/closable manner by a hinge, for example. The door frame 25 is fastened by the bolts 26*a* and the nuts 26*b* to the flange 24 installed in an end portion of the load-lock chamber 55. The workpiece W is put into and taken out of the load-lock chamber 55 by opening and closing the opening/closing door 23. The opening/closing door 23 may be configured using a shutter that is movable in the up-down direction (the Y-axis direction).

On the other hand, on the wall surface of the chamber 20 opposite to the side connected to the load-lock chamber 55, a stationary blank panel 28 is installed in the position of the opening/closing door 23*b* illustrated in FIG. 1. The blank panel 28 is fastened by the bolts 26*a* and the nuts 26*b* to the flange 24 installed in an end portion of the chamber 20.

The surface treatment apparatus 10 uses the plasma treatment apparatus 21 or the sputtering apparatus 22 to perform surface treatment while conveying the workpiece W on the timing belt 42 in the chamber 20. The surface treatment apparatus 10 may continuously perform different surface treatments by using the plasma treatment apparatus 21 and subsequently the sputtering apparatus 22, or may continuously perform different surface treatments by using the sputtering apparatus 22 and subsequently the plasma treatment apparatus 21.

[3. Structure of the Plasma Treatment Apparatus]

Figure 4:
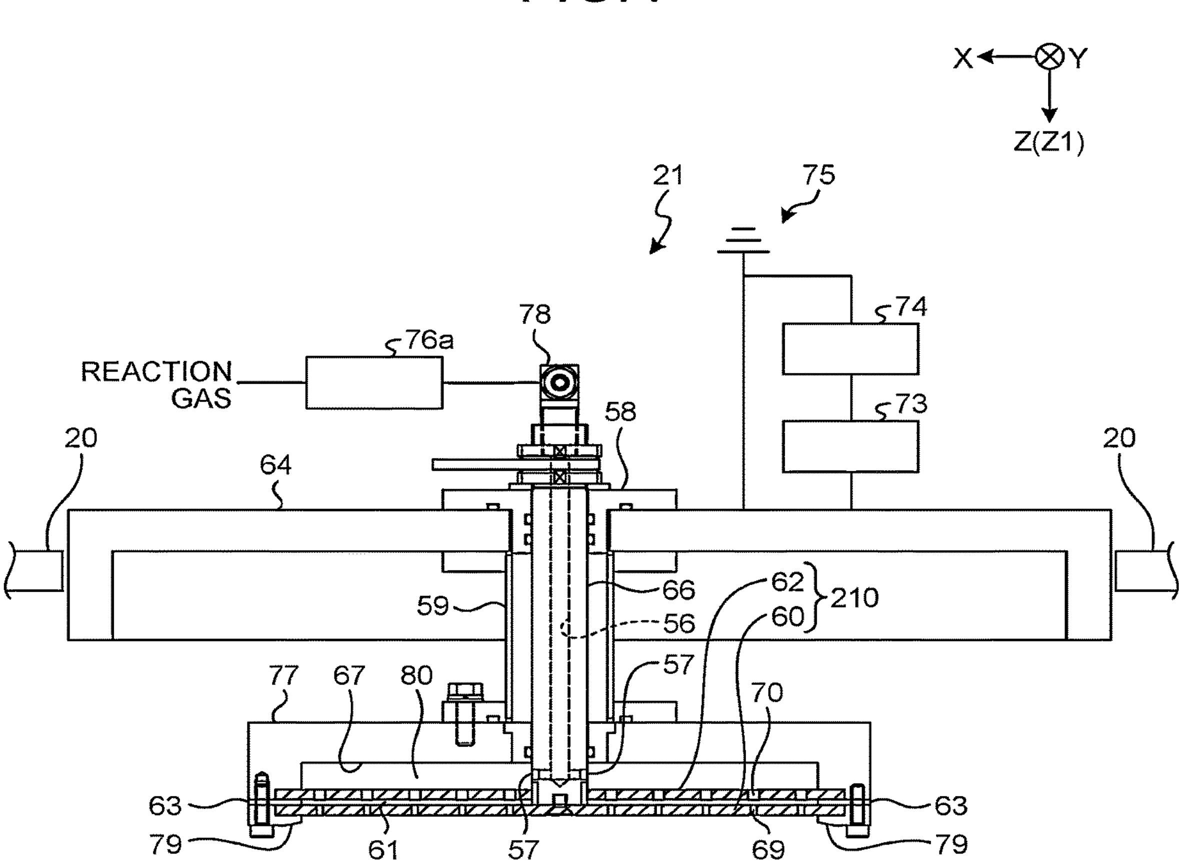
FIG. 4 is a cross-sectional view illustrating an example of a configuration of a plasma treatment apparatus.

A configuration of the plasma treatment apparatus 21 will now be described using FIG. 4. FIG. 4 is a cross-sectional view illustrating an example of a configuration of the plasma treatment apparatus.

The plasma treatment apparatus 21 includes: a gas supply pipe 66 that supplies reaction gas such as argon used when generating plasma gas; and a pair of plate-like conductor units 60 and 62 that use high-frequency voltage to generate plasma gas from reaction gas supplied from the gas supply pipe 66. As the reaction gas, for example, oxygen, argon, nitrogen, or the like is used alone or in a mixed state.

The gas supply pipe 66 penetrates a support plate 64 in the thickness direction, the support plate 64 being supported on a side wall surface of the chamber 20 to be movable along the Z-axis (a Z1-axis), and is attached to the support plate 64 by a gas supply pipe attachment member 58. A gas flow path 56 running along the extending direction of the gas supply pipe 66 is formed in the interior of the gas supply pipe 66, and reaction gas is supplied from the outside of the chamber 20 into the chamber 20 via the gas flow path 56. A gas supply unit 78 that supplies reaction gas to the gas supply pipe 66 is connected to an end portion of the gas supply pipe 66 outside the support plate 64 (outside the chamber 20), and a gas supply hole 57 that is a hole through which reaction gas that has flowed through the gas flow path 56 is introduced into the chamber 20 is formed in an end portion of the gas supply pipe 66 at the other end (inside the chamber 20). Reaction gas is supplied to the gas supply unit 78 via a mass flow controller (MFC) 76*a* in which a mass flowmeter is provided with a function of flow rate control.

The pair of plate-like conductor units 60 and 62 are each formed in a flat plate-like shape, and are formed by arranging metal plates of aluminum or the like, or other conductor plates in parallel. The plate-like conductor units 60 and 62 form the HCD electrode 210. A support plate 77 is formed of, for example, an insulating material such as glass or a ceramic. The support plate 77 is formed in a shape in which a protrusion is formed throughout the entire periphery near the outer periphery on the support plate 64 side. In other words, the support plate 77 is formed in a plate-like shape in which a recess 67 recessed along the outer periphery of the support plate 77 is formed on a side toward the interior of the chamber 20.

The support plate 77 is supported by a support member 59. The support member 59 includes a cylindrical member and attachment members located at both ends of the cylindrical member; an end portion on the negative side of the Z-axis of the support member 59 is attached to the support plate 64, and an end portion on the positive side of the Z-axis of the support member 59 is attached to the support plate 77.

The gas supply pipe 66 penetrating the support plate 64 passes through the inside of the cylindrical support member 59, extends to the position of the support plate 77, and penetrates the support plate 77. The gas supply hole 57 formed in the gas supply pipe 66 is placed in a portion of the support plate 77 where the recess 67 is formed.

The pair of plate-like conductor units 60 and 62 are placed on a side of the support plate 77 where the recess 67 is formed, in such a way as to cover the recess 67. A spacer 63 is placed near the outer periphery of a portion between the pair of plate-like conductor units 60 and 62, and the pair of plate-like conductor units 60 and 62 are stacked via the spacer 63. The pair of plate-like conductor units 60 and 62 are arranged apart from each other in a portion other than the spacer 63, and a gap 61 is formed between the plate-like conductor units 60 and 62. The spacing of the gap 61 is preferably set according to the reaction gas introduced in the plasma treatment apparatus 21, the frequency of power supplied, the size of the electrode, etc., as appropriate, and is, for example, about 3 mm to 12 mm.

In the state of being stacked via the spacer 63, the pair of plate-like conductor units 60 and 62 are held by a holding member 79 that is a member for holding the plate-like conductor units 60 and 62. That is, the holding member 79 is placed on the opposite side of the plate-like conductor units 60 and 62 from the side where the support plate 77 is located, and is attached to the support plate 77 in a state where the plate-like conductor units 60 and 62 are sandwiched between the holding member 79 and the support plate 77. A space is formed between the recess 67 of the support plate 77 and the plate-like conductor units 60 and 62.

The space thus formed functions as a gas introduction part 80 into which reaction gas supplied by the gas supply pipe 66 is introduced. The gas supply hole 57 of the gas supply pipe 66 is located at the gas introduction part 80, and is opened toward the gas introduction part 80.

Large numbers of through holes 69 and 70 penetrating in the thickness direction are formed in the pair of plate-like conductor units 60 and 62, respectively. That is, a plurality of through holes 70 are formed at predetermined intervals in a matrix form in the plate-like conductor unit 62 located on the inflow side of reaction gas supplied by the gas supply pipe 66, and a plurality of through holes 69 are formed at predetermined intervals in a matrix form in the plate-like conductor unit 60 located on the outflow side of reaction gas supplied by the gas supply pipe 66.

The through hole 69 of the plate-like conductor unit 60 and the through hole 70 of the plate-like conductor unit 62 are cylindrical holes, and both the through holes 69 and 70 are coaxially arranged. That is, the through hole 69 of the plate-like conductor unit 60 and the through hole 70 of the plate-like conductor unit 62 are arranged in positions where the centers of the through holes are aligned. Among these, the through hole 69 of the plate-like conductor unit 60 is smaller in diameter than the through hole 70 of the plate-like conductor unit 62 on the inflow side of reaction gas. Thus, pluralities of through holes 69 and 70 are formed in the pair of plate-like conductor units 60 and 62 to form a hollow electrode structure, and generated plasma gas flows at high density via the pluralities of through holes 69 and 70.

The gap 61 is interposed between the plate-like conductor units 60 and 62 of a parallel flat plate form, and the gap 61 functions as a capacitor having capacitance. In each of the support plate 77 and the plate-like conductor units 60 and 62, a conductive portion (illustration omitted) is formed by a conductive member; by the conductive portions, the support plate 77 is connected to the ground 75, and also the plate-like conductor unit 62 is connected to the ground 75. Further, one end portion of a high-frequency power source (RF) 74 is connected to the ground 75, and another end portion of the high-frequency power source 74 is electrically connected to the plate-like conductor unit 60 via a matching box (MB) 73 for adjusting capacitance, etc. to obtain matching with plasma. Therefore, when the high-frequency power source 74 is operated, the potential of the plate-like conductor unit 60 swings between plus and minus at a predetermined frequency such as 13.56 MHz, for example.

The generated plasma gas flows out from the through holes 70. Then, on the positive side of the Z-axis of the through holes 70, the plasma gas that has flowed out reacts with film-forming gas ejected from gas supply pipes 90 (see FIG. 6) described later.

[4. Structure of the Sputtering Apparatus]

Figure 5:
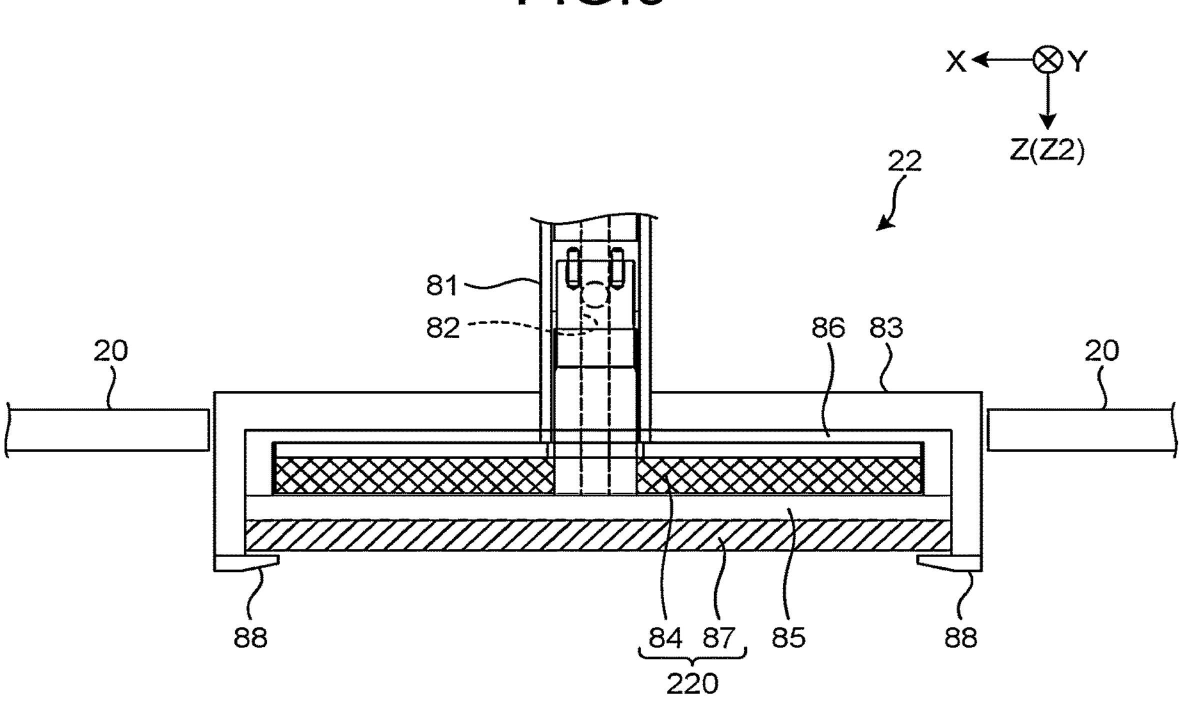
FIG. 5 is a cross-sectional view illustrating an example of a configuration of a sputtering apparatus.

A configuration of the sputtering apparatus 22 will now be described using FIG. 5. FIG. 5 is a cross-sectional view illustrating an example of a configuration of the sputtering apparatus.

The sputtering apparatus 22 includes a cooling water pipe 81, a magnet 84, a target 87, a cooling jacket 85, and a support plate 83.

The cooling water pipe 81 forms a flow path of cooling water to be supplied to the cooling jacket 85.

The magnet 84 generates a magnetic field.

The target 87 ejects atoms used for film formation by a process in which, in a magnetic field generated by the magnet 84, an inert gas for sputtering ejected from gas supply pipes 90 (see FIG. 6) described later is ionized and collided with the target 87. The target 87 is, for example, a copper plate; copper atoms ejected from the target 87 adhere to a surface of the workpiece W, and thereby a copper thin film is formed on the surface of the workpiece W. The magnet 84 and the target 87 form the sputtering electrode 220.

The cooling jacket 85 cools the target 87 by means of cooling water supplied through the cooling water pipe 81.

The support plate 83 supports the magnet 84, the target 87, and the cooling jacket 85. The cooling water pipe 81 penetrates the support plate 83 in the thickness direction, the support plate 83 being supported on a side wall surface of the chamber 20 to be movable along the Z-axis (a Z2-axis).

A cooling water path 82 running along the extending direction of the cooling water pipe 81 is formed in the interior of the cooling water pipe 81. Although not illustrated in FIG. 5, the cooling water path 82 includes: a water path through which cooling water for cooling is supplied from the outside of the chamber 20 to the cooling jacket 85; and a water path through which cooling water that has been used for cooling is discharged from the cooling jacket 85 to the outside of the chamber 20. In this manner, the cooling water pipe 81 circulates cooling water between the outside of the chamber 20 and the cooling jacket 85 placed in the chamber 20. An inflow path and a discharge path of cooling water, which are not illustrated in FIG. 5, are connected to an end portion of the cooling water pipe 81 outside the chamber 20. On the other hand, an end portion of the cooling water pipe 81 at the other end (inside the chamber 20) is connected to the cooling jacket 85. A flow path of cooling water is formed in the interior of the cooling jacket 85, and cooling water flows therethrough. The cooling water is supplied from a cooling device, which is not illustrated in FIG. 1.

A holding member 88 is attached to a lower portion of the support plate 83. The holding member 88 holds the outer periphery and the lower surface of the target 87 in a state where the magnet 84, the cooling jacket 85, and the target 87 are stacked in this order from the negative side to the positive side of the Z-axis.

An insulating material 86 is placed between the support plate 83 and the magnet 84. The insulating material 86 is placed also on an outer peripheral portion in a planar view of the magnet 84. That is, the magnet 84 is held by the support plate 83 and the holding member 88 via the insulating material 86.

The sputtering apparatus 22 performs what is called sputtering, which forms a thin film on a surface of the workpiece W. When the sputtering apparatus 22 performs sputtering, the pressure of the interior of the chamber 20 is reduced by the exhaust device 51 (see FIG. 1), and then gas used for sputtering is caused to flow into the interior of the chamber 20 from gas supply pipes 90 (see FIG. 6) described later. Then, the ionization of the gas that has flowed into the chamber 20 is promoted by a magnetic field generated by the magnet 84 of the sputtering apparatus 22, and ions are collided with the target 87. Thereby, atoms of the target 87 are ejected from the surface of the target 87.

For example, in the case where aluminum is used for the target 87, when ions of an inert gas (Ar or the like) for sputtering ionized in the vicinity of the target 87 collide with the target 87, the target 87 ejects atoms of aluminum. The atoms of aluminum ejected from the target 87 go toward the positive side of the Z-axis. Since the workpiece W is located in a position facing the surface of the target 87 in the chamber 20, the atoms of aluminum ejected from the target 87 move toward the workpiece W and adhere to the workpiece W, and are deposited on a surface of the workpiece W. Thereby, a thin film according to the substance forming the target 87 is formed on the surface of the workpiece W.

[5. Structure of Gas Supply Pipes]

Figure 6:
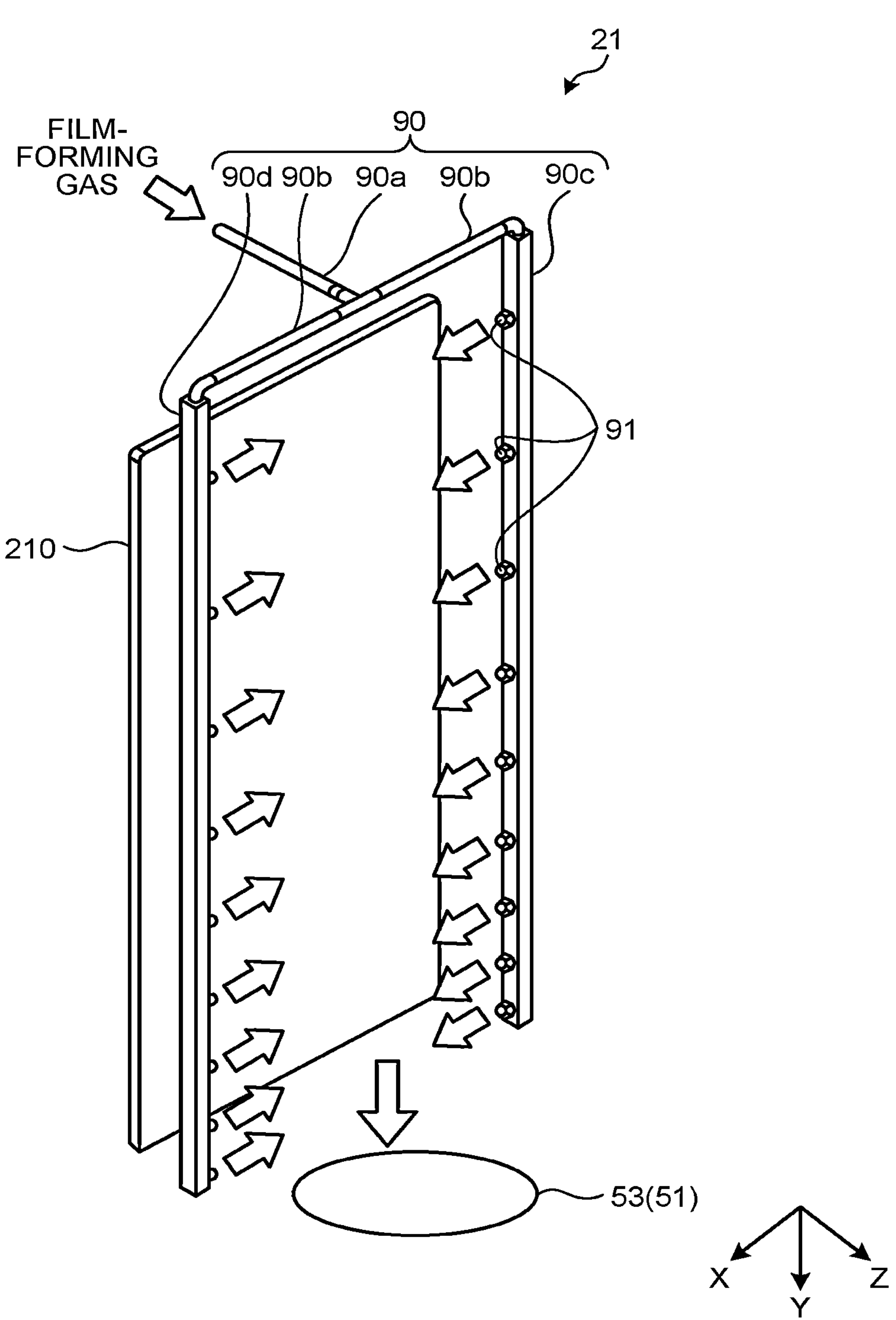
FIG. 6 is a diagram illustrating an example of a structure of gas supply pipes.

A structure of gas supply pipes 90 will now be described using FIG. 6. FIG. 6 is a diagram illustrating an example of a structure of gas supply pipes. FIG. 6 illustrates an example of a configuration of gas supply pipes 90 that are used for the plasma treatment apparatus 21 and supply film-forming gas.

In the plasma treatment apparatus 21, film-forming gas is introduced into the chamber 20 from ports via a not-illustrated mass flow controller (MFC). The film-forming gas is supplied by a gas supply pipe 90*a* extending along the Z-axis, a gas supply pipe 90*b* extending along the X-axis, and gas supply pipes 90*c* and 90*d* extending along the Y-axis.

The supplied film-forming gas is ejected from gas ejection ports 91 provided in the gas supply pipes 90*c* and 90*d*. The gas ejection ports 91 are minute holes formed on sides of the gas supply pipes 90*c* and 90*d* where the HCD electrode 210 is located. That is, in FIG. 6, in the gas supply pipe 90*c*, a plurality of gas ejection ports 91 are formed in the side surface on the positive side of the X-axis. Further, in the gas supply pipe 90*d*, a plurality of gas ejection ports 91 are formed in the side surface on the negative side of the X-axis.

During film formation treatment, film-forming gas and reaction gas that have not been used for film formation are discharged to the outside of the chamber 20 by the action of the exhaust device 51 (see FIG. 1). More specifically, the gas is discharged from an opening formed by a rising/lowering operation performed by the lifting valve 53 installed on the bottom surface of the chamber 20.

The plurality of gas ejection ports 91 are formed along the longitudinal direction of the gas supply pipes 90*c* and 90*d*. The interval between adjacent gas ejection ports 91 is set wider upstream in the flow path of film-forming gas. The interval between adjacent gas ejection ports 91 is set narrower downstream in the flow path of film-forming gas. Referring to FIG. 6, the interval between adjacent gas ejection ports 91 is wider toward the negative side of the Y-axis, and is narrower toward the positive side of the Y-axis. Thus, by a structure in which the gas ejection ports 91 provided on the gas supply pipes 90*c* and 90*d* are arranged at unequal intervals and the interval between gas ejection ports 91 is set narrower downstream, the distribution of film-forming gas on the surface of the HCD electrode 210 can be made equal between upstream and downstream in the gas supply pipes 90*c* and 90*d*. Specific examples of distribution of film-forming gas will be described later (see FIGS. 8 and 9).

As the film-forming gas, a substance according to the surface treatment performed by the plasma treatment apparatus 21 is used. For example, methane, acetylene, butadiene, titanium tetraisopropoxide (TTIP), hexamethyldisiloxane (HMDSO), tetraethoxysilane (TEOS), hexamethyldisilazane (HMDS), tetramethylsilane (TMS), and the like are used. Then, plasma gas ejected from the HCD electrode 210 and film-forming gas react together to generate a precursor, and surface treatment such as film formation or cleaning of the workpiece W in the chamber 20 is performed by the precursor.

Although description and illustration are omitted, gas supply pipes 90 that are used for the sputtering apparatus 22 and supply an inert gas or a reactive gas have a similar structure to that of FIG. 6.

[6. Cross-Sectional Structure of the Gas Supply Pipe]

Figure 7:
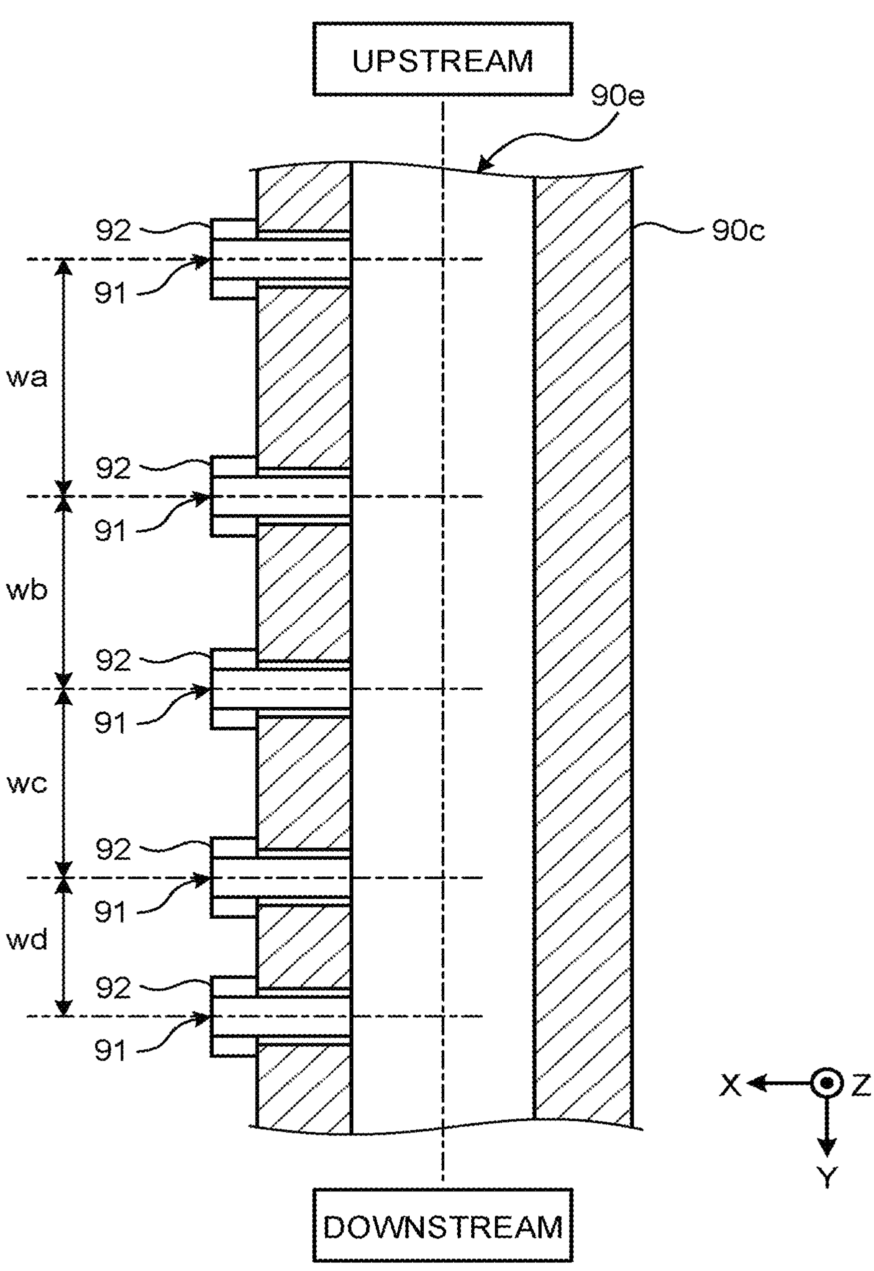
FIG. 7 is a cross-sectional view illustrating an example of a cross-sectional structure of gas ejection ports provided in the gas supply pipe.

A cross-sectional structure of the gas supply pipe 90*c* will now be described using FIG. 7. FIG. 7 is a cross-sectional view illustrating an example of a cross-sectional structure of gas ejection ports provided in the gas supply pipe.

A gas flow path 90*e* running along the gas supply pipe 90*c* is formed in the interior of the gas supply pipe 90*c*. Film-forming gas supplied to the gas supply pipe 90 flows along the gas flow path 90*e* from upstream to downstream in the gas supply pipe 90.

A plurality of hollow bolts 92 are screwed to the wall surface on the positive side of the X-axis of the gas supply pipe 90*c*, along the gas flow path 90*e*. A through hole is formed in a head portion and a screw portion of the hollow bolt 92. The through hole formed in the hollow bolt 92 allows the interior of the chamber 20 and the gas flow path 90*e* to communicate with each other. Thereby, the through hole of the hollow bolt 92 functions as a gas ejection port 91.

The interval in the Y-axis direction between adjacent hollow bolts 92 is set larger upstream in the gas supply pipe 90*c*. For example, in FIG. 7, when the intervals between adjacent hollow bolts 92 are denoted by interval wa, interval wb, interval wc, and interval wd in this order from upstream, the hollow bolts 92 are installed such that wa>wb>wc>wd.

By installing a plurality of hollow bolts 92 in this manner, the amount of film-forming gas ejected from gas ejection ports 91 can be made equal between upstream and downstream in the gas supply pipe 90*c*. Thereby, the distribution of film-forming gas on the surface of the HCD electrode 210 can be made uniform.

The hole diameter of the gas ejection port 91 can be changed by preparing a plurality of hollow bolts 92 having different hole diameters of through holes and replacing hollow bolts 92 having different hole diameters of through holes according to the contents of surface treatment performed by the surface treatment apparatus 10. Thereby, even when the flow rate of film-forming gas is changed, the distribution of film-forming gas on the surface of the HCD electrode 210 can be adjusted to be uniform. Further, the gas ejection port 91 can be sealed by using a solid bolt in place of the hollow bolt 92, and thus the state of film-forming gas ejection can be adjusted more finely.

The gas supply pipe 90*d* has the same structure as the gas supply pipe 90*c*. However, the gas ejection port 91 is formed on the negative side of the X-axis.

[7. Examples of Distribution of Mass Fractions of Film-Forming Gas]

Figure 8:
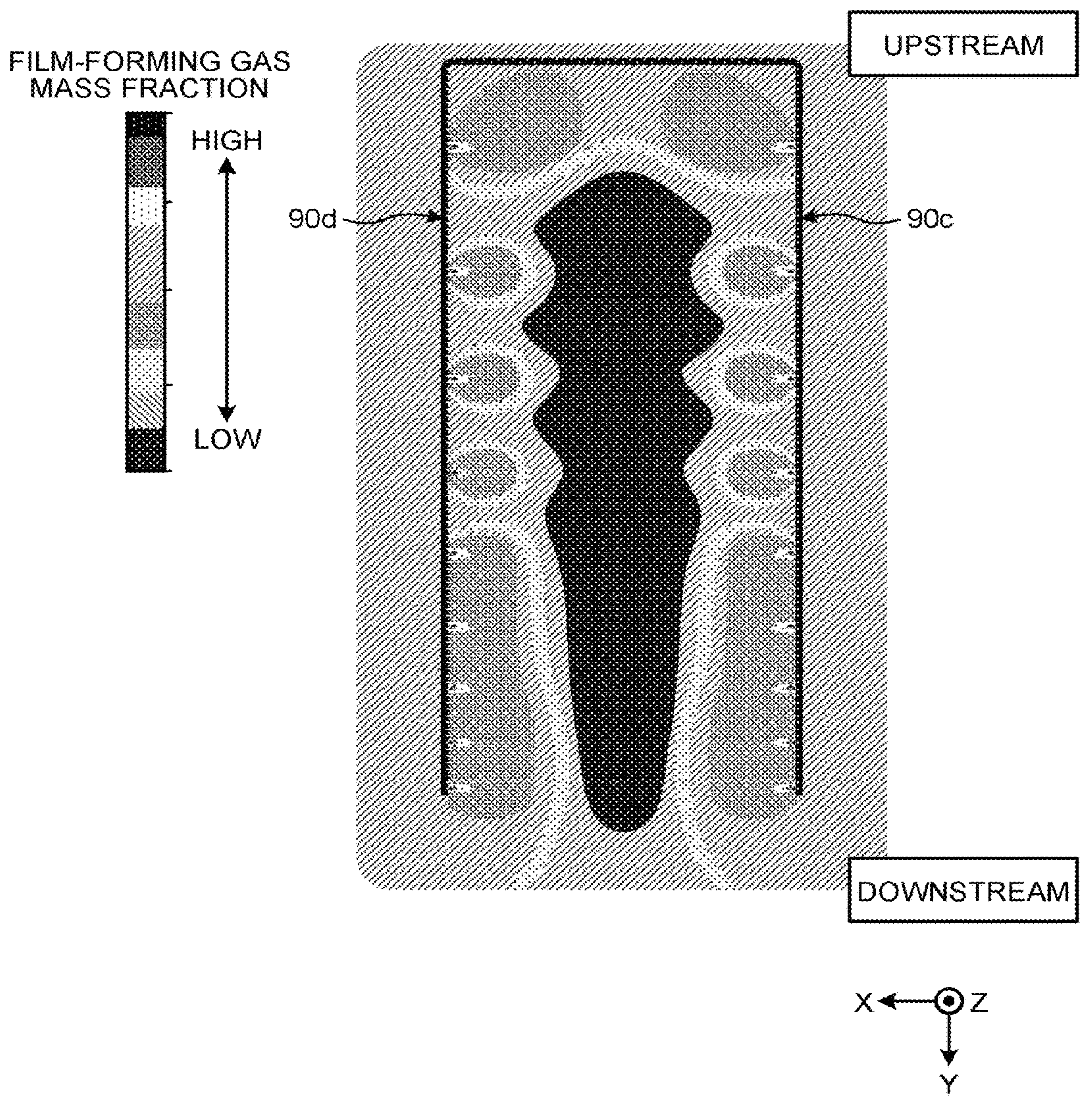
FIG. 8 is a diagram illustrating an example of distribution of, on a surface of an HCD electrode, mass fractions of film-forming gas ejected from gas ejection ports in a surface treatment apparatus according to an embodiment.
Figure 9:
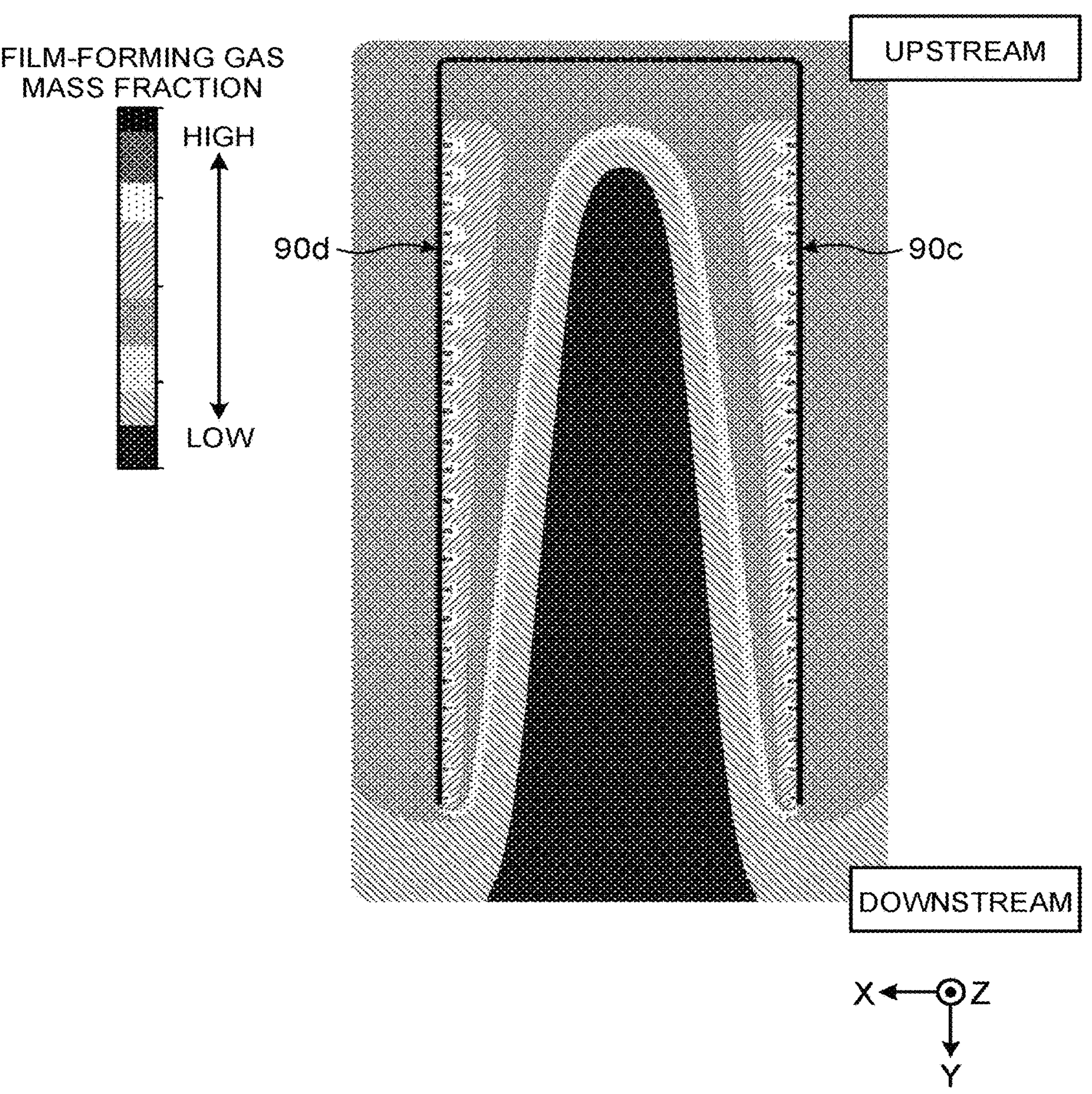
FIG. 9 is a diagram illustrating an example of distribution of, on a surface of an HCD electrode, mass fractions of film-forming gas ejected from gas ejection ports in a surface treatment apparatus according to a comparative example.

Examples of distribution of mass fractions of film-forming gas in the surface treatment apparatus 10 of the present embodiment will now be described using FIGS. 8 and 9. FIG. 8 is a diagram illustrating an example of distribution of, on a surface of an HCD electrode, mass fractions of film-forming gas ejected from gas ejection ports in a surface treatment apparatus according to an embodiment. FIG. 9 is a diagram illustrating an example of distribution of, on a surface of an HCD electrode, mass fractions of film-forming gas ejected from gas ejection ports in a surface treatment apparatus according to a comparative example.

As illustrated in FIG. 8, in a region where the HCD electrode 210 (see FIG. 6) is located, the distribution of mass fractions of film-forming gas ejected from the gas supply pipe 90*c* and the gas supply pipe 90*d* is uniform from upstream to downstream in the passage of film-forming gas.

On the other hand, FIG. 9 illustrates an example of distribution of mass fractions of film-forming gas in the case where gas ejection ports 91 (see FIG. 6) are placed at equal intervals in the gas supply pipe 90*c* and the gas supply pipe 90*d*. As can be seen from FIG. 9, in a region where the HCD electrode 210 (see FIG. 6) is located, film-forming gas ejected from the gas supply pipe 90*c* and the gas supply pipe 90*d* has a distribution in which the mass fraction is higher upstream in the passage of film-forming gas; thus, a bias occurs in distribution between upstream and downstream.

Thus, by a configuration in which the interval between gas ejection ports 91 is set to unequal intervals and the interval downstream in the gas supply pipes 90*c* and 90*d* is set narrower than that upstream, the distribution of mass fractions of film-forming gas can be made uniform from upstream to downstream.

[8. First Modification of the Cross-Sectional Structure of the Gas Supply Pipe]

Figure 10:
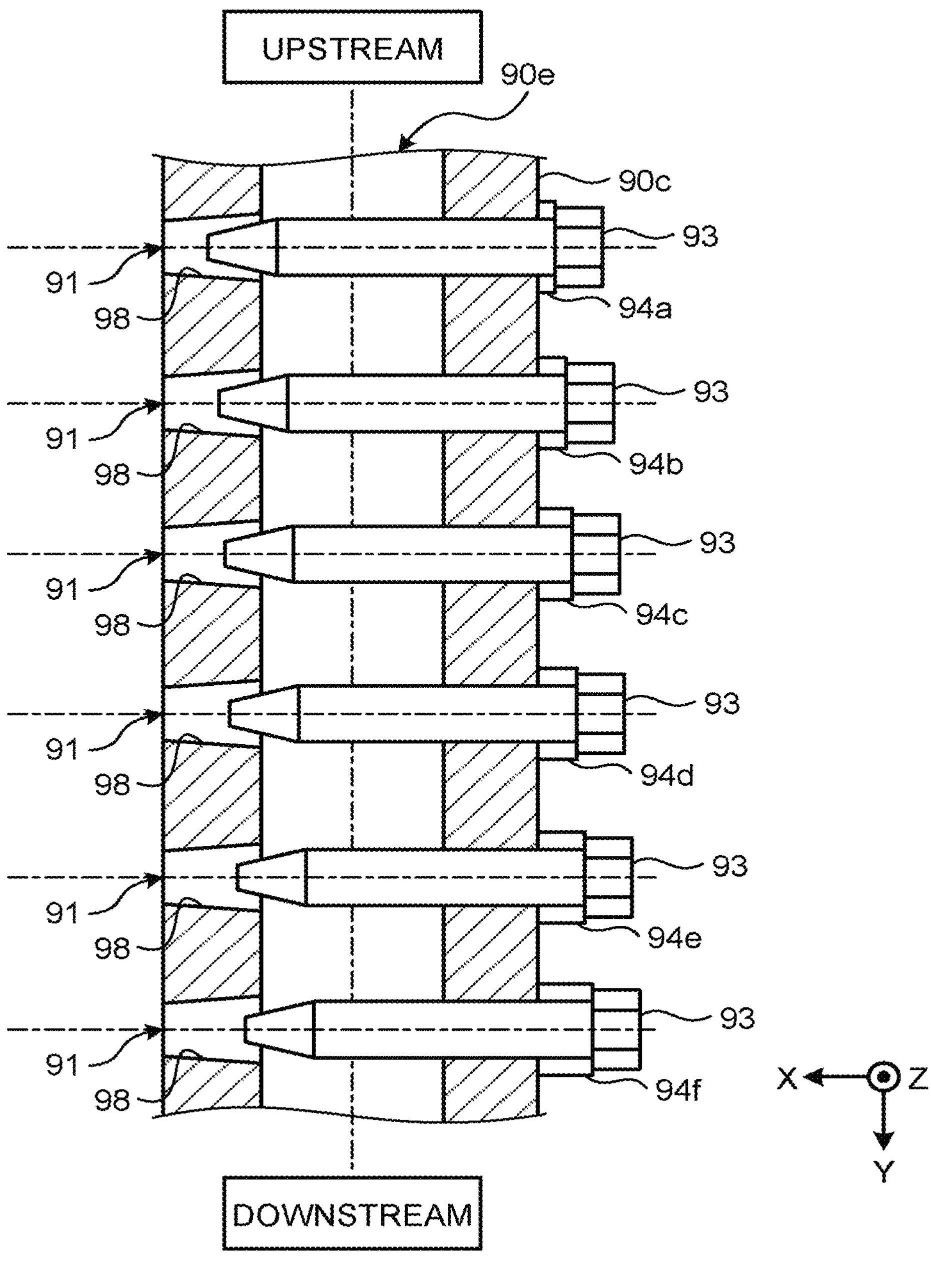
FIG. 10 is a cross-sectional view illustrating a first modification of the cross-sectional structure of gas ejection ports provided in the gas supply pipe.

A first modification of gas ejection ports 91 provided in the gas supply pipe 90*c* will now be described using FIG. 10. FIG. 10 is a cross-sectional view illustrating the first modification of the cross-sectional structure of gas ejection ports provided in the gas supply pipe.

The gas supply pipe 90*c* illustrated in FIG. 10 includes a plurality of bolts 93 penetrating from a wall surface on the negative side of the X-axis to a wall surface on the positive side of the X-axis. All the dimensions of the bolts 93 are the same. The distal end of the bolt 93 is processed in a tapered shape. The distal end of the bolt 93 and a tapered hole 98 that is formed in the wall surface on the positive side of the X-axis of the gas supply pipe 90*c* and of which the positive side of the X-axis is narrowed are arranged such that both center positions coincide with each other, and form a gas ejection port 91. Washers 94*a*, 94*b*, 94*c*, 94*d*, 94*e*, and 94*f* having different thicknesses are inserted individually between the bottom surfaces of head portions of the bolts 93 and the wall surface on the negative side of the X-axis of the gas supply pipe 90*c*. For the thicknesses of the washers 94*a*, 94*b*, 94*c*, 94*d*, 94*e*, and 94*f*, the thickness is thicker toward the positive side of the Y-axis, that is, downstream in the gas flow path 90*e*. Therefore, between the tip of the bolt 93 and the tapered hole 98, a larger gap is formed downstream in the gas flow path 90*e* than upstream. That is, the opening area of the gas ejection port 91, that is, the diameter of the gas ejection port 91 is larger downstream in the gas flow path 90*e*.

By using such a configuration, like in the embodiment described in FIG. 7, a larger amount of film-forming gas is ejected from the gas ejection port 91 downstream in the gas flow path 90*e* than upstream. Thereby, the distribution of mass fractions of film-forming gas can be made uniform from upstream to downstream. Further, the diameter of the gas ejection port 91 can be changed by changing the thicknesses of the washers 94*a*, 94*b*, 94*c*, 94*d*, 94*e*, and 94*f*, and therefore the state of film-forming gas ejection can be finely adjusted. The gas supply pipe 90*d* has a similar structure.

[9. Second Modification of the Cross-Sectional Structure of the Gas Supply Pipe]

Figure 11:
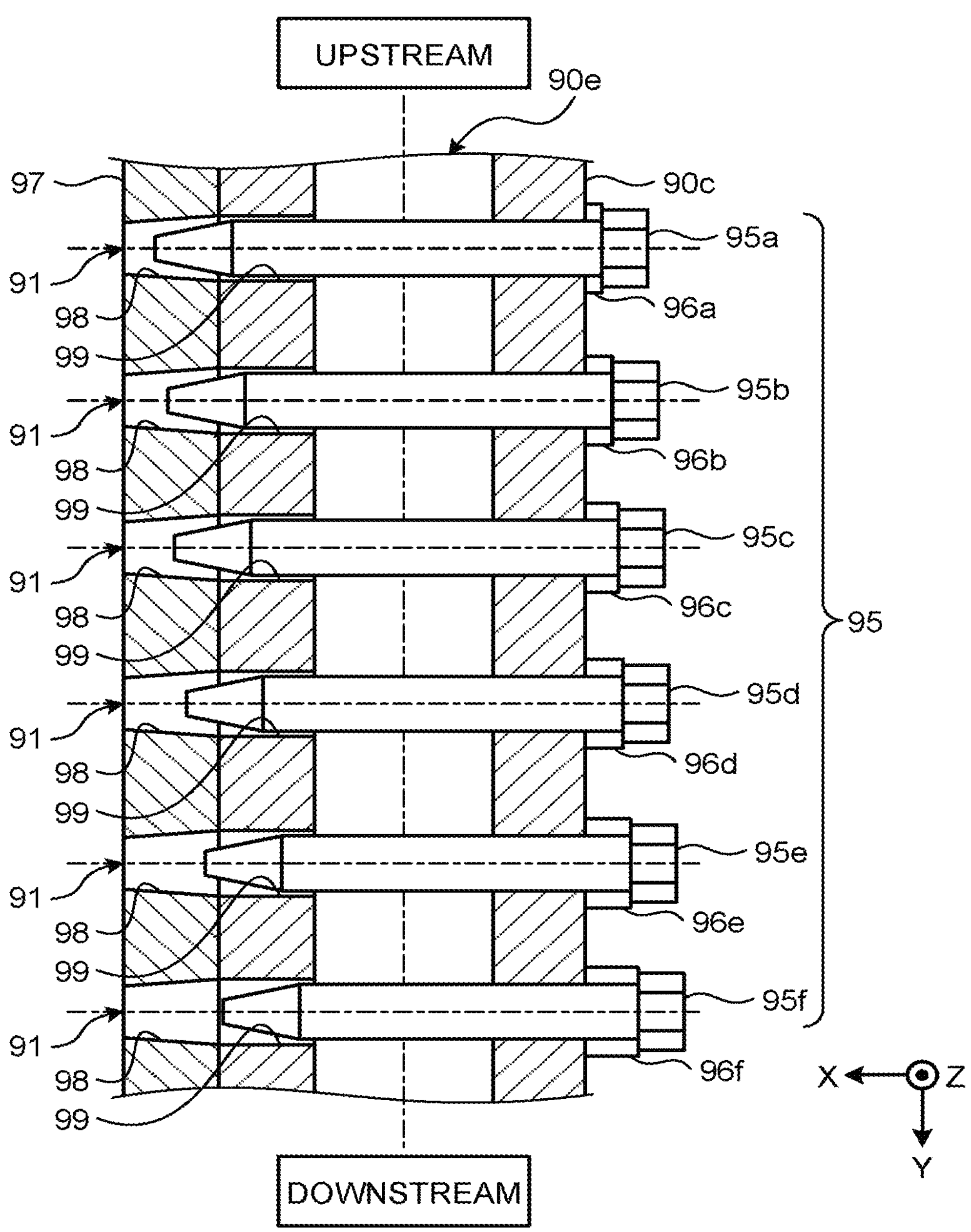
FIG. 11 is a cross-sectional view illustrating a second modification of the cross-sectional structure of gas ejection ports provided in the gas supply pipe.

A second modification of gas ejection ports 91 provided in the gas supply pipe 90*c* will now be described using FIG. 11. FIG. 11 is a cross-sectional view illustrating the second modification of the cross-sectional structure of gas ejection ports provided in the gas supply pipe.

The distribution of film-forming gas can be made uniform also by increasing the diameter of a gas ejection port 91 downstream in the gas supply pipe 90*c*. However, it is difficult to process the diameter of the gas ejection port 91 with good accuracy. The second modification of gas ejection ports 91 illustrated in FIG. 11 is an example in which the diameter of the gas ejection port 91 can be adjusted with high accuracy.

The gas supply pipe 90*c* illustrated in FIG. 11 includes bolts 95 (95*a*, 95*b*, 95*c*, 95*d*, 95*e*, and 95*f*) penetrating from a wall surface on the negative side of the X-axis to a wall surface on the positive side of the X-axis. For the dimensions of the bolt 95, a bolt 95 installed more downstream in the gas flow path 90*e* is shorter. That is, for the length of the bolt 95, the bolt 95*a*, the bolt 95*b*, the bolt 95*c*, the bolt 95*d*, the bolt 95*e*, and the bolt 95*f* are in descending order of length. The distal end of the bolt 95 is processed in a tapered shape. The distal end of the bolt 95 is inserted into a through hole 99 formed in the wall surface on the positive side of the X-axis of the gas supply pipe 90*c*.

Washers 96*a*, 96*b*, 96*c*, 96*d*, 96*e*, and 96*f* having different thicknesses are inserted individually between the bottom surfaces of head portions of the bolts 95 and the wall surface on the negative side of the X-axis of the gas supply pipe 90*c*. For the thicknesses of the washers 96*a*, 96*b*, 96*c*, 96*d*, 96*e*, and 96*f*, the thickness is thicker toward the positive side of the Y-axis, that is, downstream in the gas flow path 90*e*.

A plate-like member 97 is attached to the wall surface on the positive side of the X-axis of the gas supply pipe 90*c*. In the plate-like member 97, a tapered hole 98 of which the positive side of the X-axis is narrowed is formed in a position in contact with the through hole 99. Thereby, like in what is described in FIG. 10, the distal end of the bolt 93 and the tapered hole 98 are arranged such that both center positions coincide with each other, and form a gas ejection port 91.

Thereby, between the tip of the bolt 95 and the tapered hole 98, a larger gap is formed downstream in the gas flow path 90*e* than upstream. That is, the opening area of the gas ejection port 91, that is, the diameter of the gas ejection port 91 is larger downstream in the gas flow path 90*e*.

By using such a configuration, like in the embodiment described in FIG. 7, a larger amount of film-forming gas is ejected from the gas ejection port 91 downstream of the gas flow path 90*e* than upstream. Thereby, the distribution of mass fractions of film-forming gas can be made uniform from upstream to downstream. The gas supply pipe 90*d* has a similar structure.

In the configuration of FIG. 10, it is necessary to form the tapered hole 98 in the wall surface of the gas supply pipe 90*c*; in contrast, by using the configuration of FIG. 11, the tapered hole 98 may be formed in the plate-like member 97, and thus processing can be easily performed.

[10. Operation and Effect of the First Embodiment]

As described hereinabove, a surface treatment apparatus 10 of the present embodiment is an apparatus that, in a chamber 20, performs film formation on a surface of a workpiece W; the surface treatment apparatus 10 includes: an HCD electrode 210 (electrode) that supplies reaction gas to the workpiece W or a sputtering electrode 220 (electrode) that releases target particles to the workpiece W, the HCD electrode 210 and the sputtering electrode 220 being placed facing the workpiece W; a gas supply pipe 90 that is installed along the outer periphery of the electrode and has, along the longitudinal direction of the pipe, a plurality of gas ejection ports 91 through which film-forming gas, or an inert gas or a reactive gas for performing sputtering is supplied to an electrode surface of the electrode; and an exhaust device 51 (gas discharge unit) that discharges residual gas after film formation is ended; in the surface treatment apparatus 10, the plurality of gas ejection ports 91 are arranged such that gas supplied from the gas supply pipe 90 is uniformly distributed on the electrode surface of the electrode. Therefore, gas supplied from the gas supply pipe 90 can be uniformly distributed on the electrode surface.

Further, in the surface treatment apparatus 10 of the present embodiment, the interval between the plurality of gas ejection ports 91 of the gas supply pipe 90 is set narrower downstream in the gas supply pipe 90. Therefore, the amount of gas ejected can be increased downstream in the gas supply pipe 90, and thus the state of gas distribution on the electrode surface can be made uniform from the upstream to the downstream of the gas supply pipe 90. Further, even in the case where the exhaust device 51 is provided downstream in the gas supply pipe 90 and gas is sucked into the exhaust device 51, the state of gas distribution on the electrode surface can be made uniform.

Further, in the surface treatment apparatus 10 of the present embodiment, the diameter of each of the plurality of gas ejection ports 91 of the gas supply pipe 90 is set larger downstream in the gas supply pipe 90. Therefore, the amount of gas ejected can be increased downstream in the gas supply pipe 90, and thus the state of gas distribution on the electrode surface can be made uniform from the upstream to the downstream of the gas supply pipe 90. Further, even in the case where the exhaust device 51 is provided downstream in the gas supply pipe 90 and gas is sucked into the exhaust device 51, the state of gas distribution on the electrode surface can be made uniform.

Further, in the surface treatment apparatus 10 of the present embodiment, the plurality of gas ejection ports 91 is adjustable in diameter or sealable for each of the plurality of gas ejection ports 91. Therefore, the state of gas distribution on the electrode surface can be finely adjusted according to film formation conditions.

Further, the surface treatment apparatus 10 of the present embodiment includes a plasma treatment apparatus 21 or a sputtering apparatus 22. Therefore, various surface treatments can be performed on the workpiece W.

Second Embodiment

A second embodiment of the present disclosure will now be described. A surface treatment apparatus 10*a* of the second embodiment is an apparatus in which the HCD electrode 210 and the gas supply pipe 90 described in the first embodiment are arranged horizontally and surface treatment is performed on workpieces W arranged in a horizontal direction likewise.

[11. Configuration of the Surface Treatment Apparatus]

Figure 12:
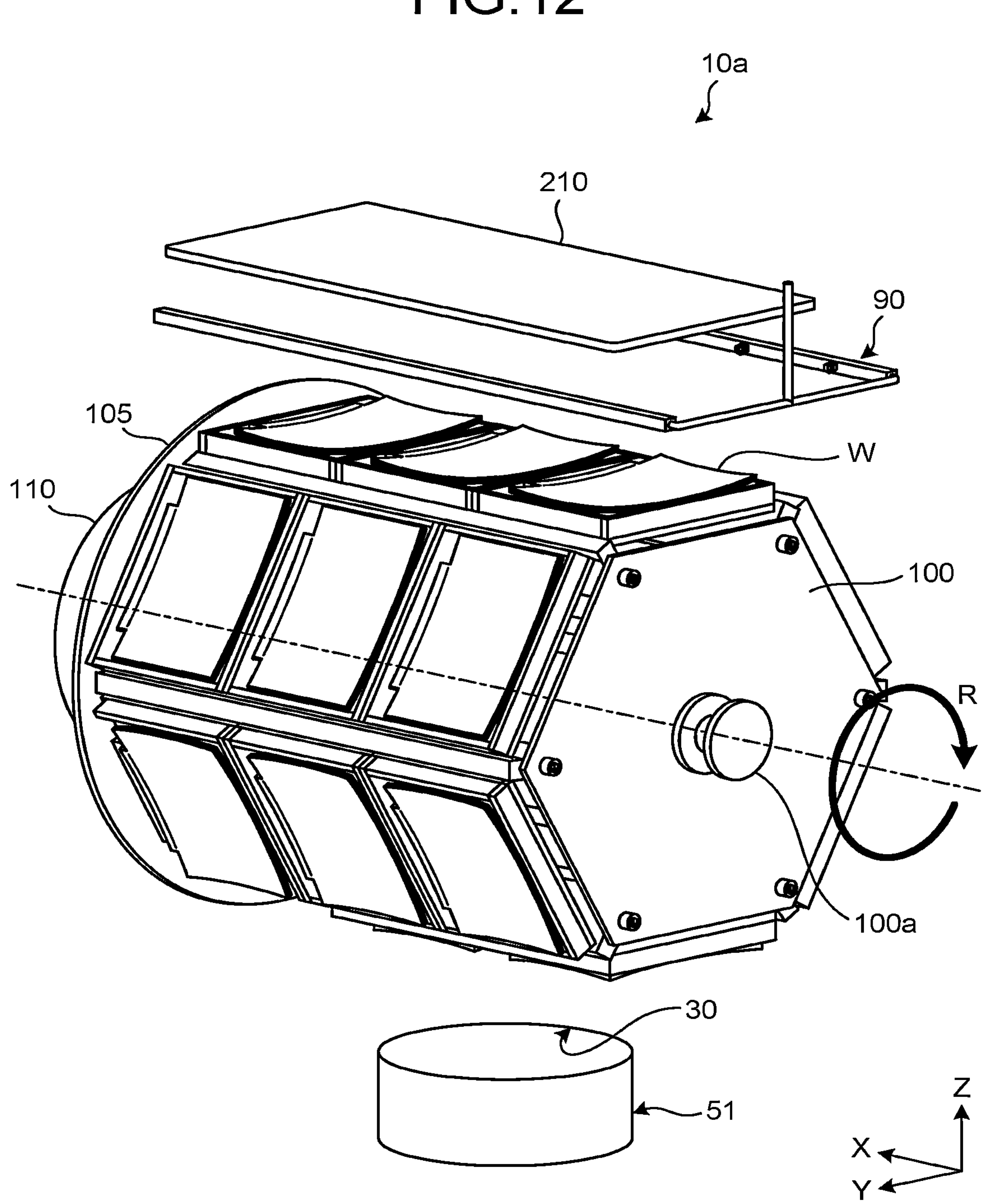
FIG. 12 is an external appearance view illustrating an example of a configuration of a main part of a surface treatment apparatus of a second embodiment.

A schematic configuration of the surface treatment apparatus 10*a* of the second embodiment will now be described using FIG. 12. FIG. 12 is an external appearance view illustrating an example of a configuration of a main part of the surface treatment apparatus of the second embodiment.

The surface treatment apparatus 10*a* is housed in a chamber, which is not illustrated in FIG. 12, and performs surface treatment on workpieces W attached to an attachment member 100.

The attachment member 100 is formed in a regular hexagonal prism shape, and three workpieces W can be attached to each side surface. That is, 18 workpieces W can be attached to one attachment member 100. The attachment member 100 is an example of a mounting device in the present disclosure.

The attachment member 100 is placed in a lying state such that a center axis 100*a* runs along a horizontal direction (the X-axis direction of FIG. 12), and is attached to a pedestal 105. The attachment member 100 is rotatable around the center axis 100*a*, that is, in the direction of arrow R by a stepping motor 110 attached to the pedestal 105. The stepping motor 110 is an example of a rotation device in the present disclosure.

The gas supply pipe 90 for performing surface treatment of the workpiece W is placed in parallel with the center axis 100*a*, that is, along a horizontal direction. The HCD electrode 210 is installed such that an electrode surface spreads along the XY plane. The attachment member 100 rotates around the center axis 100*a* in such a direction that the workpiece W faces the electrode surface of the HCD electrode 210. Thereby, the plasma treatment described in the first embodiment is performed on a surface of the workpiece W.

The gas supply pipe 90 has a similar structure to that described in the first embodiment, and thus uniformly distributes supplied gas on the electrode surface from upstream to downstream in the gas supply pipe 90. Therefore, the surface treatment apparatus 10*a* can perform uniform film formation in the X-axis direction of the workpieces W.

The surface treatment apparatus 10*a* performs surface treatment while rotating the attachment member 100 around the center axis 100*a* in such a direction that the workpiece W faces the electrode surface of the HCD electrode 210. Therefore, the surface treatment apparatus 10*a* can perform uniform film formation in the rotation direction of the workpiece W, that is, in the Y-axis direction.

Here, the shape of the attachment member 100 is not limited to the example illustrated in FIG. 12, that is, a regular hexagonal prism shape. Further, the surface treatment apparatus 10*a* may perform the sputtering treatment described in the first embodiment by installing the sputtering electrode 220 in place of the HCD electrode 210.

In FIG. 12, reaction gas generated in the chamber due to surface treatment of the workpiece W is discharged to the outside of the chamber through an exhaust device 51 having an openable/closable opening 30.

[12. Operation and Effect of the Second Embodiment]

As described hereinabove, in the surface treatment apparatus 10*a* of the present embodiment, the gas supply pipe 90 and the electrode surface of the HCD electrode 210 or the sputtering electrode 220 are arranged horizontally. Therefore, gas supplied from the gas supply pipe 90 can be uniformly distributed on the electrode surface. Thereby, uniform film formation can be performed on the workpiece W in the extending direction of the gas supply pipe 90 (the X-axis direction of FIG. 12).

Further, the surface treatment apparatus 10*a* of the present embodiment includes: an attachment member 100 (mounting device) on which a workpiece W is mounted; and a stepping motor 110 (rotation device) that, in a state where the workpiece W is mounted, rotates the attachment member 100 around a rotation axis parallel to the longitudinal direction of the gas supply pipe 90 in such a direction that the workpiece W faces the electrode surface of the HCD electrode 210 or the sputtering electrode 220. Therefore, uniform film formation can be performed on the workpiece W in the rotation direction of the workpiece W (the Y-axis direction of FIG. 12).

Hereinabove, embodiments of the present invention are described; however, the embodiments described above are presented as examples, and do not intend to limit the scope of the present invention. These novel embodiments can be implemented in various other forms. Further, various omissions, substitutions, and changes can be made without departing from the gist of the invention. Further, these embodiments are included in the scope and gist of the invention, and are included in the invention described in the claims and the equivalent scope thereof.

What is claimed is:

1. A surface treatment apparatus that performs film formation on a surface of a workpiece in a chamber, the surface treatment apparatus comprising:

an electrode that is placed facing the workpiece and supplies reaction gas or releases target particles to the workpiece;

a gas supply pipe that is installed along an outer periphery of a flat electrode surface of the electrode and has, along a longitudinal direction of the pipe, a plurality of gas ejection ports through which film-forming gas, or an inert gas or a reactive gas for performing sputtering is supplied to the electrode surface of the electrode; and a gas discharge unit that discharges residual gas after film formation is ended, wherein the plurality of gas ejection ports are arranged such that gas supplied from the gas supply pipe is uniformly distributed on the electrode surface of the electrode, wherein the gas supply pipe includes:

a plurality of bolts penetrating from a wall surface of the gas supply pipe and each having a distal end with a tapered shape;

a plurality of tapered holes formed in the wall surface of the gas supply pipe, the distal end of each bolt being arranged in the corresponding tapered hole; and a plurality of washers each arranged between the wall surface of the gas supply pipe and a bottom surface of a head portion of the corresponding bolt, and wherein a thickness of the washers are thicker downstream in the gas supply pipe whereby diameters of the plurality of gas ejection ports of the gas supply pipe are larger downstream in the gas supply pipe.

2. The surface treatment apparatus according to claim 1, wherein intervals between the plurality of gas ejection ports of the gas supply pipe are narrower downstream in the gas supply pipe.

3. The surface treatment apparatus according to claim 1, wherein diameters of the plurality of gas ejection ports of the gas supply pipe are larger downstream in the gas supply pipe.

4. The surface treatment apparatus according to claim 1, wherein the plurality of gas ejection ports are adjustable in diameter or sealable for each of the plurality of gas ejection ports.

5. The surface treatment apparatus according to claim 1, wherein the gas supply pipe and the electrode surface of the electrode are arranged horizontally.

6. The surface treatment apparatus according to claim 5, comprising:

a mounting device on which the workpiece is mounted; and a rotation device that rotating the mounting device in a state where the workpiece is mounted, around a rotation axis parallel to a longitudinal direction of the gas supply pipe in such a direction that the workpiece faces the electrode surface of the electrode.

7. The surface treatment apparatus according to claim 1, comprising:

a plasma treatment apparatus or a sputtering apparatus.

8. The surface treatment apparatus according to claim 2, wherein diameters of the plurality of gas ejection ports of the gas supply pipe are larger downstream in the gas supply pipe.

9. The surface treatment apparatus according to claim 2, wherein the plurality of gas ejection ports are adjustable in diameter or sealable for each of the plurality of gas ejection ports.

10. The surface treatment apparatus according to claim 2, wherein the gas supply pipe and the electrode surface of the electrode are arranged horizontally.

11. The surface treatment apparatus according to claim 2, comprising:

a plasma treatment apparatus or a sputtering apparatus.

12. The surface treatment apparatus according to claim 6, comprising:

a plasma treatment apparatus or a sputtering apparatus.

13. The surface treatment apparatus according to claim 1, wherein the gas supply pipe splits into two branches, with each branch positioned along the outer periphery of the flat electrode surface.

* * * * *